(12) United States Patent
Cho et al.

(10) Patent No.: US 12,464,770 B2
(45) Date of Patent: Nov. 4, 2025

(54) SEMICONDUCTOR DEVICES HAVING VERTICAL CHANNEL TRANSISTOR STRUCTURES AND METHODS OF FABRICATING THE SAME

(71) Applicant: Samsung Electronics Co., Ltd., Suwon-si (KR)

(72) Inventors: Minhee Cho, Suwon-si (KR); Kiseok Lee, Hwaseong-si (KR); Wonsok Lee, Suwon-si (KR); Mintae Ryu, Hwaseong-si (KR); Hyunmog Park, Seoul (KR); Woobin Song, Hwaseong-si (KR); Sungwon Yoo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 809 days.

(21) Appl. No.: 17/578,893

(22) Filed: Jan. 19, 2022

(65) Prior Publication Data

US 2022/0384661 A1    Dec. 1, 2022

(30) Foreign Application Priority Data

May 25, 2021    (KR) .................. 10-2021-0066831

(51) Int. Cl.
    *H10D 30/67*    (2025.01)
    *H10B 12/00*    (2023.01)
    *H10D 99/00*    (2025.01)

(52) U.S. Cl.
    CPC ......... *H10D 30/6728* (2025.01); *H10B 12/05* (2023.02); *H10B 12/315* (2023.02);
    (Continued)

(58) Field of Classification Search
    CPC ....... H01L 29/78642; H01L 21/823487; H01L 21/823885; H10B 12/05; H10B 12/315;
    (Continued)

(56) References Cited

U.S. PATENT DOCUMENTS 9,177,865 B2   11/2015   Kim et al.
9,773,888 B2 *  9/2017   Pulugurtha ......... H01L 29/7827
(Continued)

FOREIGN PATENT DOCUMENTS

KR    20120068435 A    6/2012
KR       102174333     11/2020
(Continued)

*Primary Examiner* — Phat X Cao
(74) *Attorney, Agent, or Firm* — Wolf, Greenfield & Sacks, P.C.

(57) ABSTRACT

A semiconductor device includes: a conductive line that extends in a first direction on a substrate; an insulating pattern layer on the substrate and having a trench that extends in a second direction, the trench having an extension portion that extends into the conductive line; a channel layer on opposite sidewalls of the trench and connected to a region, exposed by the trench, of the conductive line; first and second gate electrodes on the channel layer, and respectively along the opposite sidewalls of the trench; a gate insulating layer between the channel layer and the first and second gate electrodes; a buried insulating layer between the first and second gate electrodes within the trench; and a first contact and a second contact, respectively buried in the insulating pattern layer, and respectively connected to upper regions of the channel layer.

20 Claims, 17 Drawing Sheets

(52) U.S. Cl.
CPC ....... *H10D 30/673* (2025.01); *H10D 30/6755* (2025.01); *H10D 30/6757* (2025.01); *H10D 99/00* (2025.01)

(58) Field of Classification Search
CPC .............. H10B 63/34; H10D 30/6728; H10D 30/6755; H10D 84/016; H10D 84/0195
See application file for complete search history.

(56) References Cited

U.S. PATENT DOCUMENTS

| | | |
|---|---|---|
| 10,734,513 B2 | 8/2020 | Majhi et al. |
| 10,784,272 B2 | 9/2020 | Lee et al. |
| 10,854,612 B2 | 12/2020 | Cho et al. |
| 11,600,535 B2 * | 3/2023 | Yang ................... H01L 29/7827 |
| 2012/0153379 A1 * | 6/2012 | Kim ................... H01L 29/7827 |
| | | 257/329 |
| 2013/0230955 A1 * | 9/2013 | Chen ................... H10B 12/053 |
| | | 438/270 |
| 2014/0011334 A1 | 1/2014 | Cho et al. |
| 2018/0053770 A1 | 2/2018 | Kim et al. |
| 2019/0148403 A1 | 5/2019 | Kim et al. |
| 2020/0111908 A1 | 4/2020 | Sills et al. |
| 2020/0365713 A1 | 11/2020 | Kim |
| 2020/0395362 A1 | 12/2020 | Park |
| 2022/0319575 A1 | 10/2022 | Lee et al. |

FOREIGN PATENT DOCUMENTS

| | | | |
|---|---|---|---|
| KR | 20220138547 A | 10/2022 | |
| TW | 201403796 A | 1/2014 | |
| TW | 202141756 A | 11/2021 | |

* cited by examiner

SEMICONDUCTOR DEVICES HAVING VERTICAL CHANNEL TRANSISTOR STRUCTURES AND METHODS OF FABRICATING THE SAME

CROSS-REFERENCE TO RELATED APPLICATION(S)

This application claims the benefit of priority to Korean Patent Application No. 10-2021-0066831, filed on May 25, 2021, in the Korean Intellectual Property Office, and the entire contents of the above-identified application are incorporated by reference herein.

TECHNICAL FIELD

The present disclosure relates to semiconductor devices and to methods of fabricating the same.

BACKGROUND

Semiconductor devices have become increasingly highly integrated for a variety of reasons, including to satisfy requirements for higher levels of performance desired by customers.

Integration of typical two-dimensional or planar semiconductor devices is primarily determined by the area occupied by a unit memory cell. Reducing an area occupied by a unit memory cell requires an ability to form fine patterns (e.g., via semiconductor lithography), and as such, the integration of planar semiconductor devices is significantly affected by the level of technology for forming fine patterns. However, as significantly expensive process equipment is typically required to generate increasingly fine patterns, a practical limitation exists with respect to increasing the integration density of two-dimensional semiconductor devices. Therefore, three-dimensional semiconductor memory devices including three-dimensionally-arranged memory cells have been proposed.

SUMMARY

Aspects of the present disclosure provide semiconductor devices having vertical channel transistor (VCT) structures with improved electrical characteristics.

Aspects of the present disclosure provide methods of fabricating semiconductor devices having VCT structures with improved electrical characteristics.

According to some embodiments of the present disclosure, a semiconductor device may include: a substrate; a conductive line on the substrate and extending in a first direction; and an insulating pattern layer on the substrate and having a trench that extends in a second direction that intersects the first direction. The trench may have an extension portion that extends inwardly of the conductive line. The semiconductor device may include a channel layer on opposite sidewalls of the trench and connected to a region of the conductive line that is exposed by the extension portion of the trench. The semiconductor device may include a first gate electrode and a second gate electrode on the channel layer, and respectively along the opposite sidewalls of the trench; a gate insulating layer between the channel layer and the first and second gate electrodes; a buried insulating layer between the first and second gate electrodes within the trench; and a first contact and a second contact respectively buried in regions adjacent to the opposite sidewalls of the trench in the insulating pattern layer, and respectively connected to upper regions of the channel layer.

According to some example embodiments, a semiconductor device may include: a substrate; a plurality of conductive lines extending in a first direction on the substrate, and spaced apart from each other in a second direction that intersects the first direction; an insulating pattern layer that extends in the second direction on the substrate, and having a plurality of trenches spaced apart from each other in the first direction, each trench of the plurality of trenches having an extension portion that extends into the plurality of conductive lines; a plurality of channel layers on opposite sidewalls of each of the plurality of trenches and arranged in the second direction, the channel layers connected to regions exposed in the plurality of conductive lines exposed by the extension portions of the plurality of trenches; a plurality of first gate electrodes and a plurality of second gate electrodes on the plurality of channel layers in each of the plurality of trenches, and respectively extending on the opposite sidewalls of each of the plurality of trenches; a plurality of gate insulating layers between the plurality of channel layers and the plurality of first and second gate electrodes in each of the plurality of trenches; a plurality of buried insulating portions, respectively within the plurality of trenches, and between the plurality of first and second gate electrodes; and a plurality of first contacts and a plurality of second contacts buried in the insulating pattern layer and connected to upper regions of the plurality of channel layers adjacent to the opposite sidewalls of each of the plurality of trenches.

According to an example embodiment, a semiconductor device includes: a substrate; a conductive line extending in a first direction on the substrate; an insulating pattern layer on the substrate and having a trench that extends in a second direction that intersects the first direction; a channel layer arranged on opposite sidewalls of the trench and electrically connected to the conductive line at a bottom of the trench, the channel layer including an oxide semiconductor; a first gate electrode and a second gate electrode respectively on the opposite sidewalls of the trench on the channel layer; a gate insulating layer between the channel layer and the first and second gate electrodes and having a U-shape in a cross-section taken in the second direction; a buried insulating portion between the first and second gate electrodes within the trench and including a material that is different from a material of the insulating pattern layer; and a first contact and a second contact, electrically connected with respective upper regions of the channel layer.

According to some example embodiments, a method of fabricating a semiconductor device includes: forming a conductive line that extends in a first direction on a substrate; forming an oxide insulating layer on the substrate that covers the conductive line; forming a trench that extends in a second direction in the oxide insulating layer and has a bottom that exposes a region of the conductive line, the second direction intersecting the first direction; forming a channel layer including an oxide semiconductor on opposite sidewalls of the trench and connected to the exposed region of the conductive line; forming a gate insulating layer on an internal sidewall of the trench that covers the channel layer; forming a first gate electrode and a second gate electrode on each of the opposite sidewalls of the trench on the channel layer; forming a buried insulating portion between the first and second gate electrodes within the trench, the buried insulating portion comprising a material that is different from a material of the oxide insulating layer; forming a first contact and a second contact connected to respective upper regions of the channel layer; and annealing the channel layer in an oxygen-containing atmosphere.

BRIEF DESCRIPTION OF DRAWINGS

The above and other aspects, features, and advantages of the present disclosure will be more clearly understood from the following detailed description, taken in conjunction with the accompanying drawings.

FIGS. 10A to 17A are flow cross-sectional views illustrating operations of a method of fabricating a semiconductor device according to some example embodiments, and FIGS. 10B to 17B are plan views of cross-sectional structures illustrated in FIGS. 10A to 17A, respectively.

DETAILED DESCRIPTION

Hereinafter, some example embodiments will be described with reference to the accompanying drawings.

Figure 1:
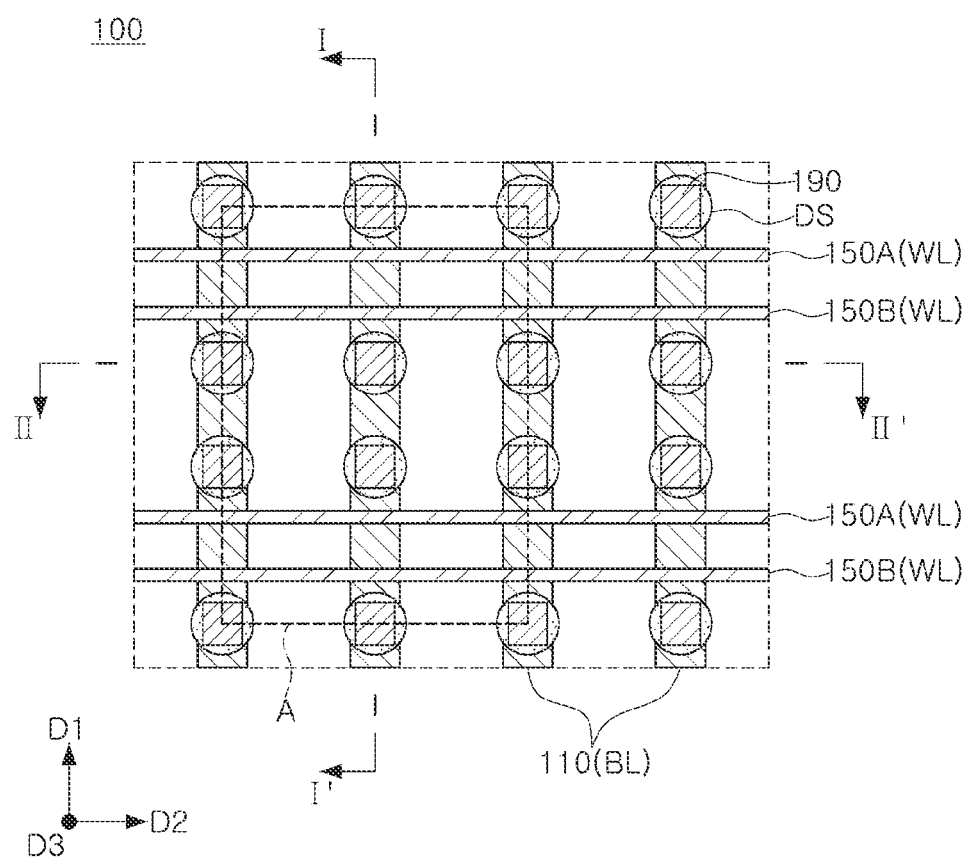
FIG. 1 is a plan view of a semiconductor device according to some example embodiments.
Figure 2A:
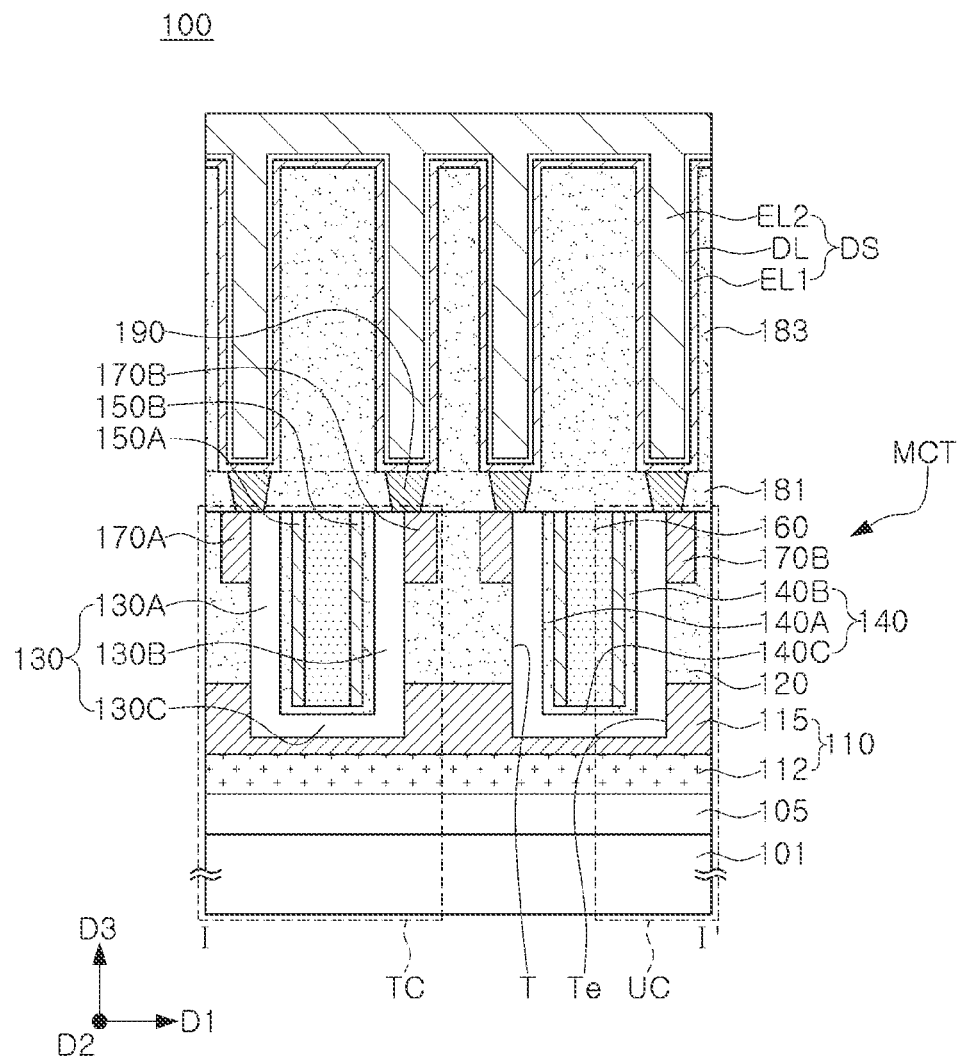
FIGS. 2A and 2B are cross-sectional views taken along lines I-I' and II-II' of the semiconductor device of FIG. 1, respectively.
Figure 2B:
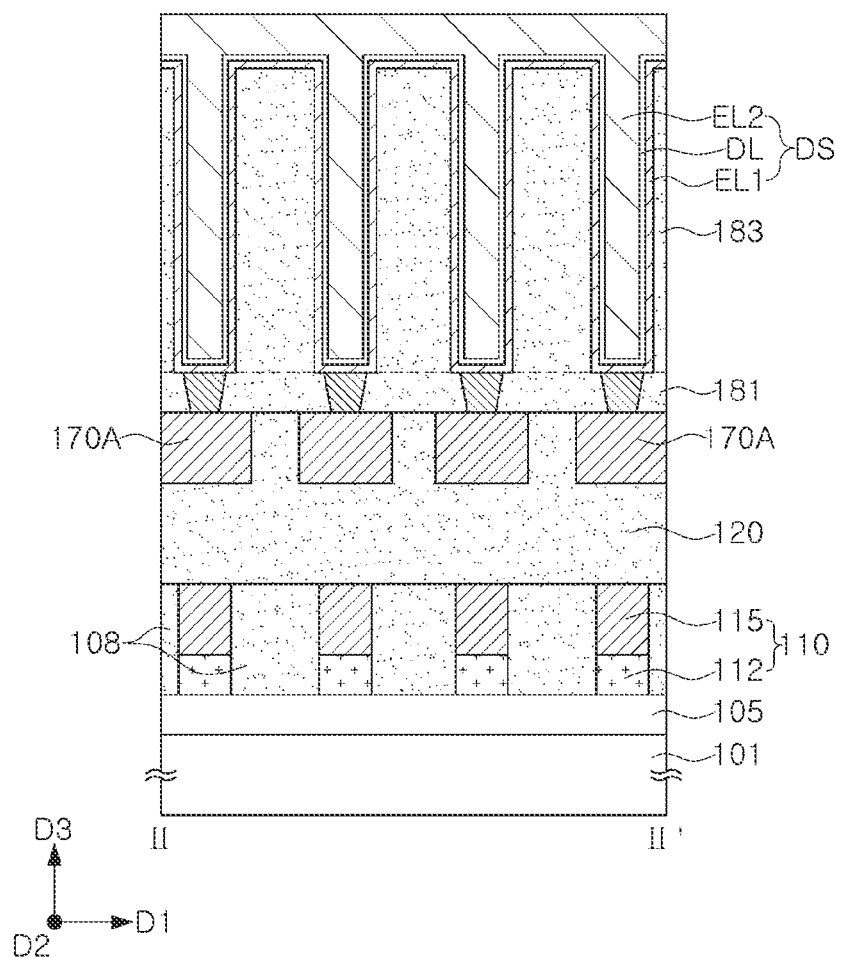

FIG. 1 is a plan view of a semiconductor device according to some example embodiments, and FIGS. 2A and 2B are cross-sectional views taken along lines I-I' and II-II' of the semiconductor device of FIG. 1, respectively.

Referring to FIGS. 1, 2A, and 2B, a semiconductor device 100 according to some example embodiments may include a cell array implemented using a semiconductor memory device. As illustrated in FIG. 1, the cell array may include a plurality of bitlines BL that extend in length in a first direction D1 and a plurality of wordlines WL that extend in length in a second direction D2 that intersects the first direction D1. The cell array may include a plurality of memory cell transistors MCT, with each memory cell transistor MCT arranged at a respective intersection between a wordline WL of the plurality of wordlines WL and a bitline BL of the plurality of bitlines BL. At least one of a plurality of data storage elements DS may be arranged in each of the plurality of cell transistors MCT.

The substrate 101 may be a silicon substrate, a germanium substrate, or a silicon-germanium substrate. An insulating layer 105 may be on the substrate 101. The semiconductor device 100 may have a structure in which a plurality of bitlines BL or 110, a plurality of memory cell transistors MCT, a plurality of wordlines WL or 150, and a plurality of data storage elements DS are sequentially stacked on the substrate 101 in a third direction D3, perpendicular to an upper surface of the substrate 101.

The plurality of bitlines BL may include a plurality of conductive lines 110 arranged side by side in the second direction D2 on the substrate 101. Each of the plurality of conductive lines 110 may have a width in the second direction D2. The plurality of conductive lines 110 may be electrically separated from the substrate 101 by the insulating layer 105. The plurality of conductive lines 110 may be separated from each other by a first insulating pattern layer 108. The first insulating pattern layer 108 may have an upper surface that is substantially planar with an upper surface of the plurality of first conductive lines 110. Each of the plurality of conductive lines 110 may include a single conductive layer or a plurality of conductive layers. For example, the bitlines BL may include at least one of a doped semiconductor material (doped silicon, doped germanium, or the like), a conductive metal nitride (titanium nitride, tantalum nitride, or the like), a metal (tungsten, titanium, tantalum, or the like), and a metal-semiconductor compound (tungsten silicide, cobalt silicide, titanium silicide, or the like). In some example embodiments, the plurality of conductive lines 110 may each include a first conductive layer 112 such as tungsten (W) and a second conductive layer 115, such as titanium nitride (TiN), arranged on the first conductive layer 112. In some example embodiments, the first insulating pattern layer 108 may include at least one of a silicon oxide layer, a silicon nitride layer, and a silicon oxynitride layer.

Figure 3:
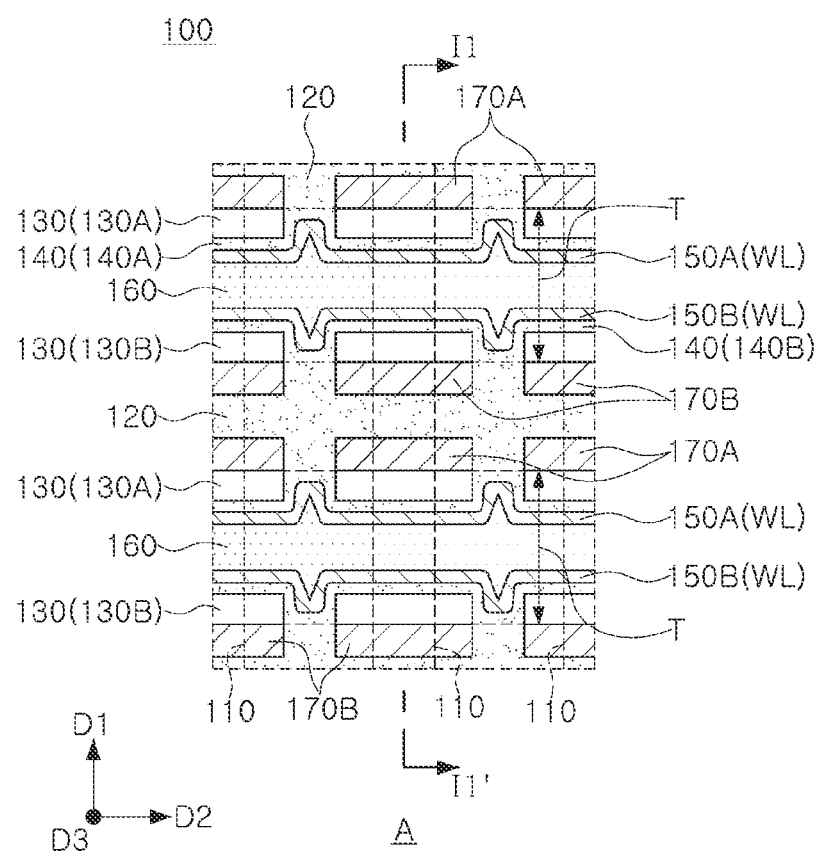
FIG. 3 is a plan view of a memory cell transistor (MCT) array in a region "A" of the semiconductor device of FIG. 1.

The wordlines WL may be connected with and/or include first and second gate electrodes 150A and 150B of the memory cell transistors MCT on the substrate 101. In the cell array (see FIG. 1), the wordlines WL may be spaced apart from each other in a first direction D1. FIG. 3 is a plan view of a memory cell transistor (MCT) array in the region "A" of the semiconductor device of FIG. 1. Referring to FIG. 3 together with FIG. 1, each of the first and second gate electrodes 150A and 150B may extend in length in the second direction D2 and may be provided as gate electrodes of the plurality of memory cell transistors MCT arranged in the second direction D2. In some example embodiments, the wordlines WL may be provided as separate conductive lines connected to the first and second gate electrodes 150A and 150B. For example, such wordlines (not illustrated) may include a conductive material similar to that of the bitlines BL, and may be on a first insulating layer 181 and connected with upper ends of the first and second gate electrodes 150A and 150B.

As described above, a gate of the memory cell transistor MCT may be connected to a wordline WL, and a source of the memory cell transistor MCT may be connected to a bitline BL.

The memory cell transistor MCT of the semiconductor device 100 according to some example embodiments may include a vertical channel transistor VCT. Such a vertical channel transistor may include a channel layer 130 having a length of a channel that extends in the third direction D3, perpendicular to an upper surface of the substrate 101.

A second insulating pattern layer 120 may be on the first insulating pattern layer 108 and the plurality of conductive lines 110. The second insulating pattern layer 120 may include a trench T that defines a vertical channel transistor region. The trench T may extend in the second direction D2, and a partial region of the conductive line 110 may be exposed through a bottom surface of the trench T (see FIGS. 12A and 12B). In some example embodiments, the trench T may have an extension portion Te that extends inwardly of the conductive line 110. Stated differently, the extending or extension portion Te of the trench T may extend into the conductive line 110 or a portion thereof. As illustrated in FIG. 2A, the extension portion Te of the trench T may be arranged in the second conductive layer 115 of the conductive lines. The second insulating pattern layer 120 may include a material that is similar to that of the first insulating pattern layer 108. For example, the second insulating pattern layer 120 may include at least one of a silicon oxide layer and a silicon oxynitride layer.

A plurality of channel layers 130 may be on opposite sidewalls of the trench T and may be connected to a region of the conductive line 110 that is exposed by the extension portion Te of the trench T. Stated differently, the plurality of channel layers 130 may be within the trench T. The plurality of channel layers 130 may be arranged in a matrix form in the first direction D1 and the second direction D2 to be respectively disposed on regions, exposed by the trench T, of the conductive line 110.

In some example embodiments, and as seen in FIG. 2A, the channel layer 130 may have a U-shape in a cross-section in the first direction D1. Specifically, as illustrated in FIG. 2A, the channel layers 130 may have first and second vertical channel elements 130A and 130B that extend in the third direction D3 along respective and opposite sidewalls of the trench T of the second insulating pattern layer 120, and a horizontal connection portion 130C that connects the first and second vertical channel elements 130A and 130B and extends along a bottom of the trench T. The channel layer 130 may have a width defined in the first direction D1 and a height (Lc of FIG. 4) in the third direction D3. The height (Lc in FIG. 4) of the channel layer 130 may be larger than the width of the channel layer 130. For example, the height may be about 2 to 10 times the first width, but the present disclosure and the example embodiments thereof are not limited thereto.

Each of the first and second vertical channel elements 130A and 130B may have a lower region that overlaps the conductive line 110 (or a portion thereof) in a horizontal direction (for example, the first direction D1). An upper surface of the conductive line 110 (for example, a region in which the trench T is not formed) may be higher than a lowermost level of the first and second vertical channel elements 130A and 130B. The horizontal connection portion 130C may be connected to the conductive line 110. An upper surface of the horizontal connection portion 130C may be below an upper surface of the conductive line 110. In some embodiments, the horizontal connection portion 130C may be buried within the conductive line 110.

In some embodiments, first and second contacts 170A and 170B may be buried in the second insulating layer 120 in respective regions thereof that are adjacent to the opposite sidewalls of the trench T. The first and second contacts 170A and 170B may be connected to upper regions of the channel layers 130. The first contact 170A may be connected to the first vertical channel element 130A, and the second contact 170B may be connected to the second vertical channel element 130B. The first and second contacts 170A and 170B may be in partial contact with the channel layer 130 in a horizontal direction (for example, the first direction D1).

As described above, the lower region or the bottom portion (for example, the horizontal connection portion 130C) of the channel layer 130 may be connected to the conductive line 110 and may provide a first source/drain region, and the upper region of the channel layer 130 may be connected to the first and second contacts 170A and 170B and may provide a second source/drain region. A region of the channel layer 130 between the first and second source/drain regions, for example, a partial region of the first and second horizontal channel elements 130A and 130B, may serve as a channel region.

In some example embodiments, as illustrated in FIGS. 2A, 2B, and 3, a portion of the upper surface of the second insulating pattern layer 120 may be provided as an upper surface of the memory cell transistor MCT in a region between the first and second contacts 170A and 170B. Such an opened upper region of the second insulating pattern layer 120 may be provided as a path to the channel layer 130, because oxygen may be introduced thereinto when an annealing process is applied in an oxygen atmosphere to improve characteristics of the channel layer 130 (for example, an oxide semiconductor). This will be described in detail later with reference to FIG. 4.

In some example embodiments, the channel layer 130 may have low leakage current characteristics and may include a stackable oxide semiconductor. For example, the channel layer 130 may include an oxide semiconductor containing indium (In). The oxide semiconductor may be one of indium-gallium-zinc oxide (IGZO), indium tin zinc oxide (ITZO), indium tin gallium oxide (ITGO), indium tungsten oxide (IWO), indium tin oxide (ITO), ZnO, and $Cu_2O$. In some example embodiments, the channel layer 130 may have a multilayer structure. For example, the channel layer 130 may include a combination of amorphous indium-gallium-zinc oxide (a-IGZO) and c-axis aligned crystalline indium-gallium-zinc oxide (CAAC-IGZO), a combination of a-IGZO and Spinel IGZO, or a combination of IGZO and other oxide semiconductors. The channel layer 130 is not limited thereto. In some embodiments, the channel layer 130 may have a bandgap energy greater than a bandgap energy of silicon. For example, the channel layer 130 may be a polycrystalline or amorphous layer having a bandgap energy of about 1.5 eV to 5.6 eV or about 2.0 eV to 4.0 eV. The channel layer 130 may include $MoS_2$, $WS_2$, graphene, or hexagonal boron nitride (h-BN).

The gate insulating layer 140 may surround a sidewall of the channel layer 130. In some example embodiments, the gate insulating layer 140 may extend in the first direction D1 to cover the plurality of channel layers 130 arranged along a single trench T (see FIG. 3). The gate insulating layer 140 may have a U-shape in a cross-section (see FIG. 2A) in the first direction D1 that is similar to the U-shape cross-section of the channel layer 130. In some example embodiments, as illustrated in FIG. 2A, the gate insulating layer 140 may include a first gate insulating element 140A on the first vertical channel element 130A, a second gate insulating element 140B on the second vertical channel element 130B, and a bottom insulting portion 140C that connects the first and second gate insulating elements 140A and 140B to each other. The gate insulating layer 140 may include a silicon oxide layer, a silicon oxynitride layer, a high-k dielectric layer having a higher dielectric constant than the silicon oxide layer, and/or combinations thereof, with the present disclosure not limited thereto. The high-k dielectric layer may include, but is not limited to, $HfO_2$, HfSiO, HfSiON, HfTaO, HfTiO, HfZrO, $ZrO_2$, $Al_2O_3$, or combinations thereof.

The first and second gate electrodes 150A and 150B may be on respective and opposite sidewalls of the channel layer 130, with the gate insulating layer 140 interposed therebetween. As illustrated in FIG. 3, the first and second gate electrodes 150A and 150B may be divided into a plurality of gate electrodes, respectively arranged to correspond to the first and second vertical channel elements 130A and 130B of the channel layer 130 in a single trench T. The first and second gate electrodes 150A and 150B may include doped polysilicon, a metal, conductive metal nitride, conductive metal silicide, conductive metal oxide, and/or combinations thereof. For example, the first and second gate electrodes 150A and 150B may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, and/or combinations thereof.

As illustrated in FIGS. 2A and 3, each channel layer 130 in a single trench T and first and second gate electrodes 150A and 150B facing each other in the channel layer 130 may constitute a dual transistor structure DT. That is, each of the dual transistor structures TC may include two unit transistor cells UC having a bilateral symmetrical structure. The first vertical channel element 130A, the first gate electrode 150A, and a portion of the gate insulating film 140 therebetween may constitute one unit transistor cell UC. Similarly, the second vertical channel element 130B, the second gate electrode 150B, and a portion of the gate insulating layer 140 therebetween may constitute another unit transistor cell UC.

A buried insulating part 160 may be in the first direction D1 along a facing unit transistor cell UC in a single trench T. The buried insulating part 160 may extend in the first direction D1 to fill some or all of a remaining space in the trench T along the space between the first and second gate electrodes 150A and 150B (FIG. see 3). The buried insulating part 160 may have an upper surface that is substantially planar with an upper end of the channel layer 130. In addition, the upper surface of the buried insulating part 160 may be substantially planar with an upper surface of the gate insulating layer 140 and upper ends of the first and second gate electrodes 150A and 150B.

A plurality of interconnection portions 190 may connect the first and second contacts 170A and 170B to the first insulating layer 181 on the upper surface of the memory cell transistor MCT. The plurality of interconnection portions 190 may extend to overlap a partial region of the channel layer 130 in the third direction D3. As illustrated in FIG. 1, the plurality of interconnection portions 190 may be arranged in a matrix to be spaced apart from each other in the first direction D1 and the second direction D2. For example, the interconnect portions 190 may include, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or combinations thereof.

A second insulating layer 183 may be on the first insulating layer 181, and data storage elements DS may be in or on the second insulating layer 183. The data storage elements DS may be arranged in a matrix form to respectively correspond to the interconnection portions 190 (see FIG. 1). The data storage elements DS may be memory elements which may store data. Each of the data storage elements DS may be a memory element that uses a capacitor, a memory element that uses a magnetic tunnel junction pattern, or a memory element that uses a variable resistor including a phase change material. As an example, each of the data storage elements DS may be a capacitor. Each of the memory cell transistors MCT may be configured to be connected to a respective data storage element DS. In some embodiments, the data storage element DS may be a capacitor and a drain of the memory cell transistor MCT may be connected to the capacitor.

Specifically, each of the data storage elements DS may include a first electrode EL1, a dielectric layer DL, and a second electrode EL2 connected to each of the interconnections 190. In some example embodiments, the data storage elements DS may share a single dielectric layer DL and a single second electrode EL2. In other words, a plurality of first electrodes EL1 may be provided, and a single dielectric layer DL may cover surfaces of the first electrodes EL1. A single second electrode EL2 may be provided on a single dielectric layer DL. Each of the first electrodes EL1 may be in the form of a cylinder having one end open. The second electrode EL2 may fill the inside of the cylinder of the first electrode EL1. The present disclosure and the second electrode EL2 thereof are not limited to such a structure. For example, the second electrode may be provided in a pillar structure.

Each of the first electrode EL1 and the second electrode EL2 may include at least one of a metal (for example, titanium, tantalum, tungsten, copper, or aluminum), conductive metal nitride (for example, titanium nitride or tantalum nitride), and/or a doped semiconductor material (for example, doped silicon or doped germanium). The dielectric layer DL may include a high-k dielectric material (for example, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, and/or combinations thereof).

In some example embodiments, as described above, the channel layer 130, and in particular the first and second vertical channel elements 130A and 130B thereof, may contact each other while partially overlapping the conductive line 110 and the first and second contacts 170A and 170B. Thus, the channel layer 130 may be formed to have an effective channel length that is lower than a physically vertical length Lc of the channel layer 130. As a result, ON-current characteristics (that is, Ion) of the channel layer 130 may be improved. Hereinafter, this will be described in greater detail with reference to FIG. 4.

Figure 4:
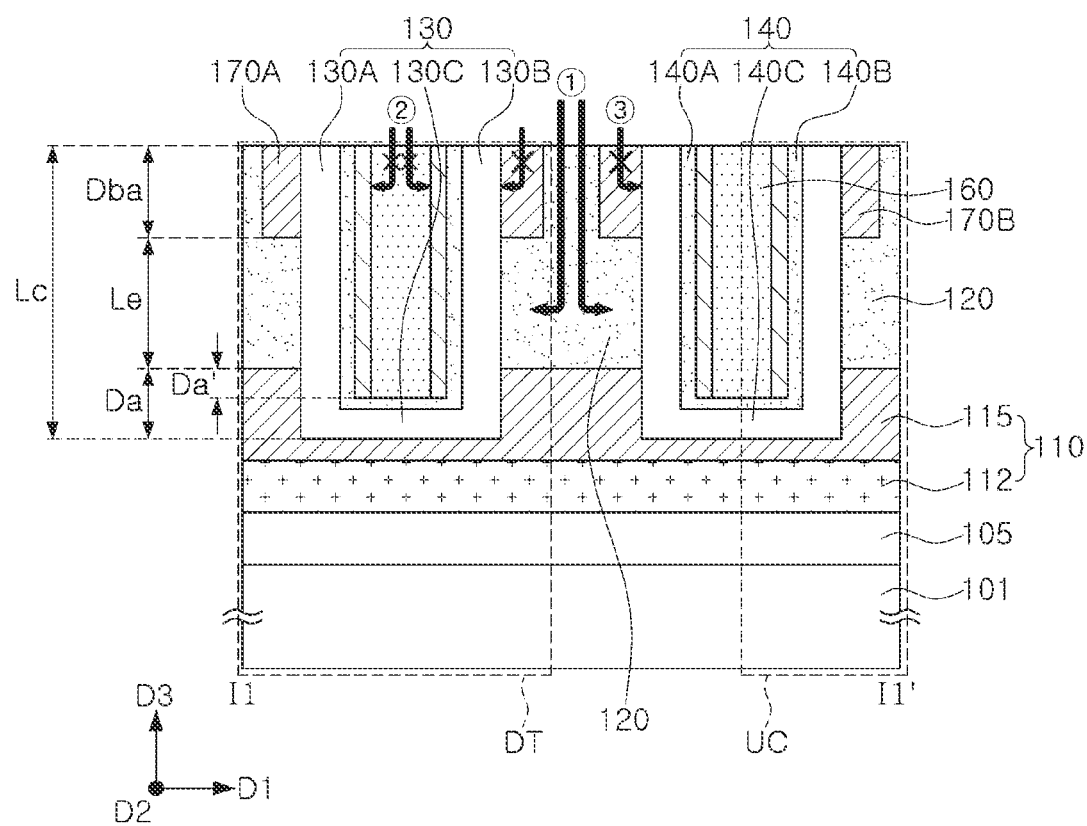
FIG. 4 is a cross-sectional view taken along line II-II' of the MCT array of FIG. 3.

FIG. 4 is a cross-sectional view taken along line II-II' of the MCT array of FIG. 3.

Referring to FIG. 4, a vertical length Lc of the channel layer 130, or in other words, heights of the first and second vertical channel elements 130A and 130B may be defined as a depth of the trench T. In some example embodiments, the vertical length Lc may be represented as the sum of a height of the second insulating pattern layer 120 and a depth of an extension portion Te of the trench T formed in the conductive line 110.

A lower region of each of the first and second vertical channel elements 130A and 130B may overlap the conductive line 110 in a horizontal direction (for example, the first direction D1) by a width corresponding to a depth Da of the extension portion Te of the trench. In an upper surface of the conductive line 110, a region in which the trench T is not formed may be higher than a lowermost level of the first and second gate electrodes 150A and 150B by a height denoted by Da'. An upper region of each of the first and second vertical channel elements 130A and 130B may partially overlap the first and second contacts 170A and 170B in the horizontal direction (for example, D1) by a depth Db at which the first and second contacts 170A and 170B are buried.

The effective channel length of the channel layer 130 may be defined as a value Le obtained by excluding a total length of overlapping portions Da+Db from the physically vertical length Lc of the channel layer 130 (e.g., Le=Lc−Da−Db). As described above, the arrangement of elements corresponding to a source/drain electrode may be structurally adjusted to reduce the effective channel length Le of the channel layer 130, and thus, ON-current characteristics (that is, Ion) of the channel layer 130 may be improved. For example, the effective channel length Le of the channel layer 130 may range from 10 nm to 200 nm. Each of the widths Da and Db of the overlapping portions may range from 2 nm to 50 nm.

A channel layer material such as an oxide semiconductor (for example, IGZO) may be problematic in current characteristics due to relatively low carrier mobility while being stackable and having low leakage current characteristics. However, the channel layer may be changed to have a structure that overlaps the first and second contacts 170A and 170B and/or the conductive lines 110, so that current characteristics may be significantly improved. For example, when the channel layer is IGZO, an ON-current (Ion) characteristic may be increased by 10 to 20 times by employing a structure similar to that of FIG. 2A. In some example embodiments, only a contact structure of one side of the first and second contacts 170A and 170B and the conductive lines 110 may overlap the channel layer 130 (see FIGS. 8 and 9).

In addition, an annealing process may be applied to the plurality of channel layers 130 to improve electrical characteristics (for example, channel leakage current characteristics when turned off). For example, when the plurality of channel layers 130 include an oxide semiconductor, an annealing process may be applied in an oxygen atmosphere.

In some example embodiments, a path through which oxygen is introduced through a region of the second insulating pattern layer 120 between the first and second contacts 170A and 170B to permeate into the channel layer 130, as indicated by ① of FIG. 3, during an annealing process in an oxygen atmosphere, may be formed. The second insulating pattern layer 120 may be an oxygen-containing insulating material. For example, the second insulating pattern layer 120 may include silicon oxide ($SiO_2$) or silicon oxynitride (SiON).

In addition, the present disclosure provides several methods of protecting a specific region from oxygen permeation during an oxygen annealing process.

To protect the first and second gate electrodes 150A and 150B from oxygen permeation (see ②), the buried insulating portion 160 may be provided as a material that is different from the second insulating pattern layer 120. For example, the buried insulating portion 160 may be provided as an oxygen blocking layer. In some example embodiments, the buried insulating portion 160 may include an insulating material that has an oxygen diffusivity that is lower than oxygen diffusivity in the material of the second insulating pattern layer 120 under the same or equal conditions (for example, annealing conditions). For example, the buried insulating portion 160 may include silicon nitride ($SiN_x$), silicon oxynitride (SiON), or aluminum oxide ($AlO_x$).

In the channel layer 130, a region corresponding to a source/drain may be protected from the oxygen permeation by the first and second contacts 170A and 170B. The first and second contacts 170A and 170B may include a conductive material having an oxygen diffusivity that is lower than oxygen diffusivity in the material of the second insulating pattern layer 120 under the same or equal conditions (for example, annealing conditions). For example, the first and second contacts 170A and 170B may include at least one of TiN, W, Cu, Ti, Ta, TaN, and Mo.

FIGS. 5 to 9 are cross-sectional views of semiconductor devices according to some example embodiments.

Figure 5:
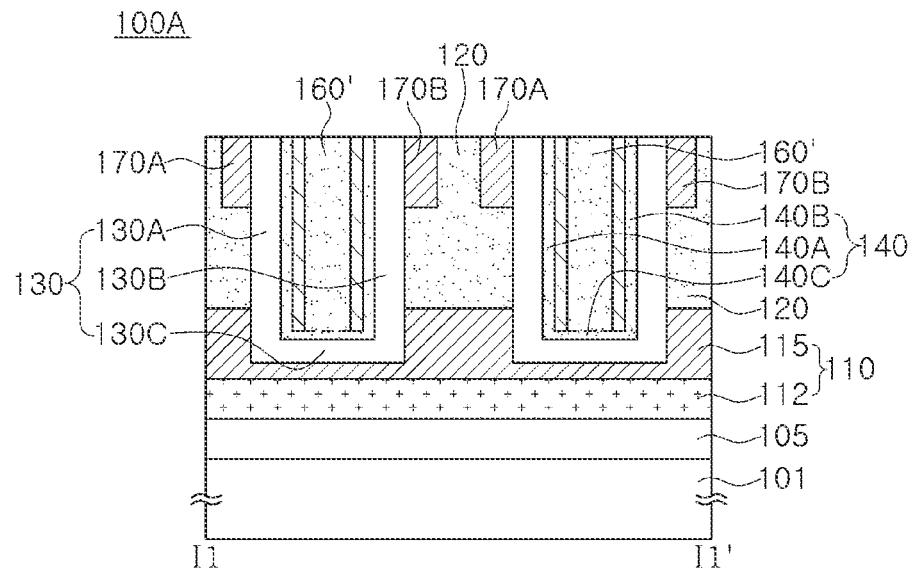
FIGS. 5 to 9 are cross-sectional views of semiconductor devices according to some example embodiments.

Referring to FIG. 5, a semiconductor device 100A according to some example embodiments may be understood to be similar to the semiconductor device 100 illustrated in FIGS. 1 to 4, except that a buried insulating portion 160' may be formed of the same material as a second insulating pattern layer 120. In addition, elements of some example embodiments in accordance with FIG. 5 may be understood with reference to the descriptions of the same or similar elements of the semiconductor device 100 illustrated in FIGS. 1 to 4, unless otherwise specified.

The semiconductor device 100A according to some example embodiments may include a buried insulating portion 160' having the same insulating material as the second insulating pattern layer 120. For example, the buried insulating portion 160' and the second insulating pattern layer 120 may include at least one of a silicon oxide layer and a silicon oxynitride layer. In some example embodiments, an annealing process may be performed in an oxygen atmosphere after a channel layer 130 is formed and before the buried insulating portion 160' is formed (for example, see FIGS. 13A and 13B). In this case, even when the buried insulating portion 160' is formed of an oxygen-containing insulating material such as silicon oxide, characteristics of the first and second gate electrodes 150A and 150B may be prevented from being adversely affected by annealing.

Figure 6:
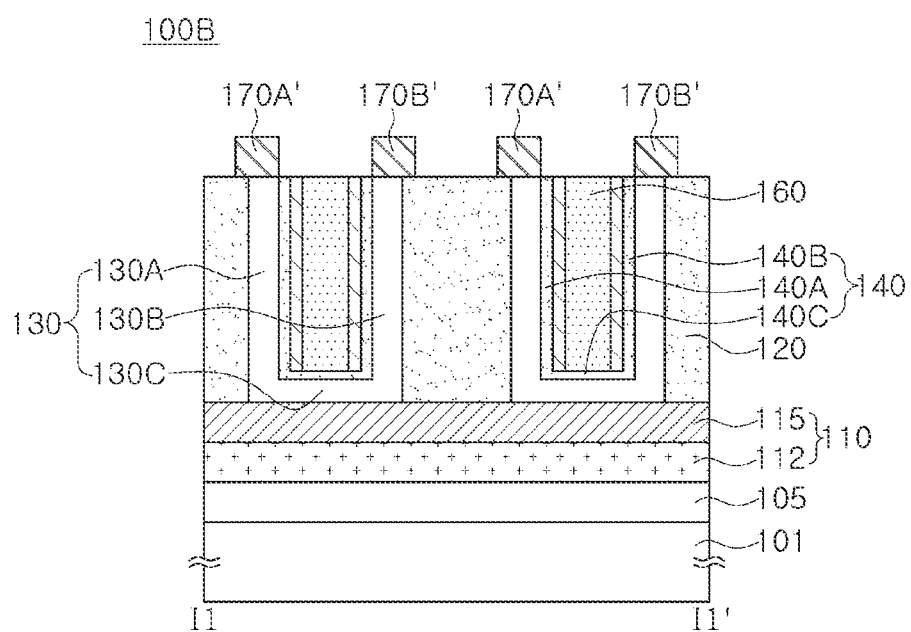

Referring to FIG. 6, a semiconductor device 100B according to some example embodiments may be understood to be similar to the semiconductor device 100 illustrated in FIGS. 1 to 4, except that a channel layer 130 does not overlap a conductive line 110 and first and second contacts 170A and 170B in a horizontal direction (for example, the first direction D1). In addition, elements of some example embodiments in accordance with FIG. 6 may be understood with reference to the descriptions of the same or similar elements of the semiconductor device 100 illustrated in FIGS. 1 to 4, unless otherwise specified.

The semiconductor device 100B according to some example embodiments may introduce a configuration for improving characteristics of a channel layer 130 and protecting gate electrodes 150A and 150B by an annealing process as illustrated in FIG. 2A, rather than a configuration in which the channel layer 130 does not overlap the conductive line 110 and the first and second contacts 170A and 170B in the horizontal direction (for example, the first direction D1). Specifically, a portion of an upper surface region of the second insulating pattern layer 120 may be exposed between adjacent trenches, in particular, between the first and second contacts 170A and 170B, so that the channel layer 130 may be cured by oxygen introduced through the exposed region of the second insulating pattern layer 120 during an annealing process to significantly improve leakage current characteristic of the channel layer 130. Unlike the second insulating pattern layer 120, a buried insulating portion 160 may be formed of an insulating material which does not contain oxygen. Thus, the first and second gate electrodes 150A and 150B may be protected from oxygen permeation which may occur in an annealing process after a memory cell transistor MCT is formed.

Figure 7:
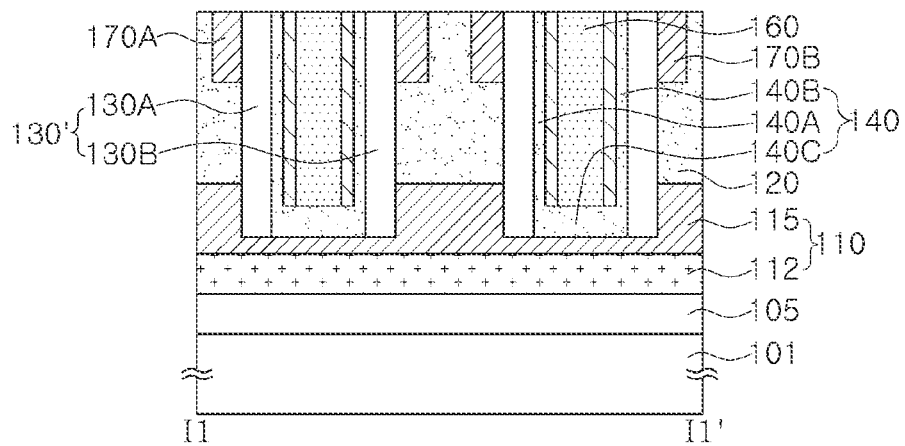

Referring to FIG. 7, a semiconductor device 100C according to some example embodiments may be understood to be similar to the semiconductor device 100 illustrated in FIG. 4, except that a channel layer 130' may be provided after being separated into first and second horizontal channel elements 130A and 130B. In addition, elements of some example embodiments in accordance with FIG. 7 may be understood with reference to the descriptions of the same or similar elements of the semiconductor device 100 illustrated in FIGS. 1 to 4, unless otherwise specified.

The semiconductor device 100C according to some example embodiments may be configured such that the first and second horizontal channel elements 130A and 130B, respectively provided as channels of a unit transistor cell, may be separated from each other. Although a single channel layer 130 is shared in a dual transistor structure DT in the example embodiments discussed with reference to FIG. 2A, the first and second horizontal channel elements 130A and 130B may not be connected to each other on a bottom of a trench, in a similar manner to first and second gate electrodes 150A and 150B. Lower regions of the first and second horizontal channel elements 130A and 130B may each be connected to a conductive line 110. In some example embodiments, since bottoms as well as side surfaces of the lower regions of the first and second horizontal channel elements 130A and 130B are connected to the conductive line 110, a sufficient contact area may be provided.

Figure 8:
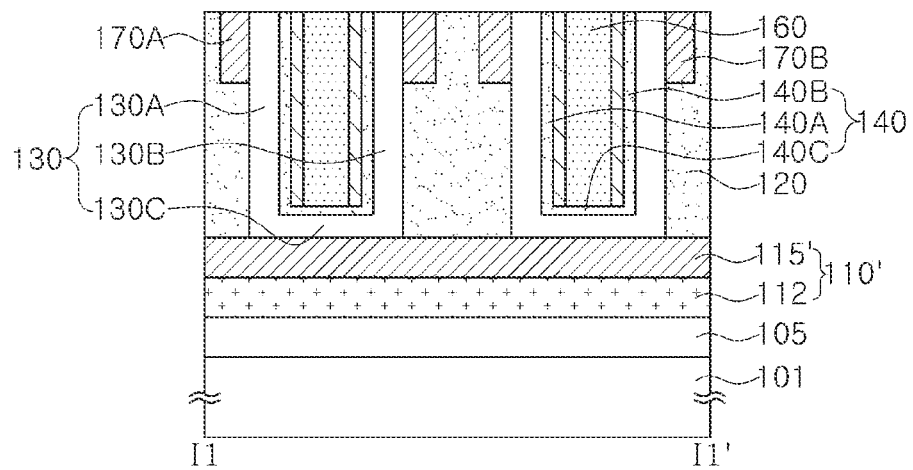

Referring to FIG. 8, the semiconductor device 100D according to some example embodiments may be understood to be similar to the semiconductor device 100 illustrated in FIGS. 1 to 4, except that a trench (or a channel layer 130) does not extend inwardly of a conductive line 110. In addition, elements of some example embodiments in accordance with FIG. 8 may be understood with reference to the descriptions of the same or similar elements of the semiconductor device 100 illustrated in FIGS. 1 to 4, unless otherwise specified.

In some example embodiments, first and second contacts 170A and 170B as drain contacts may overlap the channel layer 130 in a horizontal direction (for example, the first direction D1), whereas a conductive line 110' as a source contact may not overlap the channel layer 130 in the horizontal direction (for example, the first direction D1). Accordingly, a channel length may be reduced only by burying the first and second contacts 170A and 170B.

Specifically, similarly to the example embodiments discussed with reference to FIG. 2A, the first and second contacts 170A and 170B may be buried in regions adjacent to opposite sidewalls of a trench in a second insulating pattern layer 120 and may connected to side surfaces of upper regions of the channel layer 130 and first and second horizontal channel elements 130A and 130B, respectively. On the other hand, the trench may be formed to extend only to an upper surface of a conductive line 110' and may not extend inwardly of the conductive line 110', and the channel layer 130 formed along the trench may be on an upper surface of the conductive line 110'.

Figure 9:
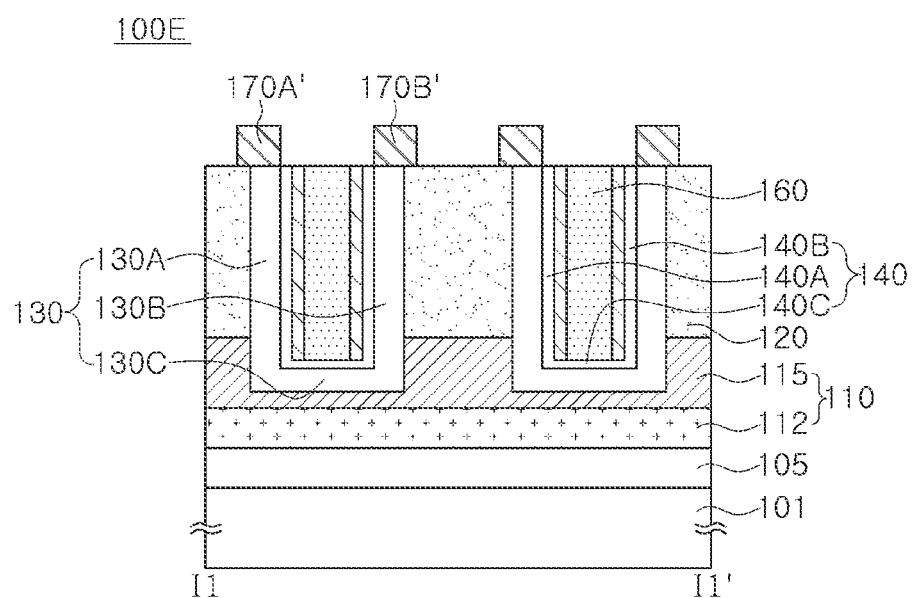

Referring to FIG. 9, the semiconductor device 100E according to some example embodiments may be understood to be similar to the semiconductor device 100 illustrated in FIGS. 1 to 4, except that first and second contacts 170A and 170B are not buried in a second insulating pattern layer 120. In addition, elements of some example embodiments in accordance with FIG. 9 may be understood with reference to the descriptions of the same or similar elements of the semiconductor device 100 illustrated in FIGS. 1 to 4, unless otherwise specified.

In some example embodiments, a conductive line 110 as a source contact may overlap a channel layer 130 in a horizontal direction (for example, the first direction D1), whereas first and second contacts 170A and 170B as the drain contact may not overlap a channel layer 130 in the horizontal direction (for example, the first direction D1). Accordingly, unlike the example embodiment illustrated in FIG. 8, a channel length may be reduced by positioning a portion of the channel layer inside (in a recessed region) of the conductive line 110.

Specifically, similarly to the example embodiment illustrated in FIG. 2, a trench may have an extension portion that extends inwardly of the inductive line 110 (also referred to as a "recess" of the conductive line 110), and the channel layer 130 formed along the trench may be disposed in the recess of the conductive line 110. The channel layer 130 may overlap the conductive line 110 in the horizontal direction (for example, the first direction D1) by a depth of the recess. On the other hand, the first and second contacts 170A' and 170B' may be arranged on (rather than within) the second insulating pattern layer 120, and may be connected to upper surfaces of upper regions of the first and second horizontal channel elements 130A and 130B without an overlapping portion in the horizontal direction (for example, the first direction D1).

FIGS. 10A to 17A are flow cross-sectional views illustrating operations of a method of fabricating a semiconductor device according to some example embodiments, and FIGS. 10B to 17B are plan views of cross-sectional structures illustrated in FIGS. 10A to 17A, respectively.

A fabrication process according to some example embodiments may be understood to be a process of fabricating the memory cell transistor of the semiconductor device illustrated in FIG. 2A, and each process cross-sectional view and each plan view illustrate regions corresponding to FIGS. 4 and 3.

Figure 10A:
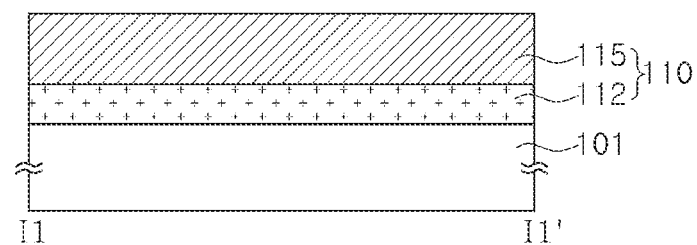
Figure 10B:
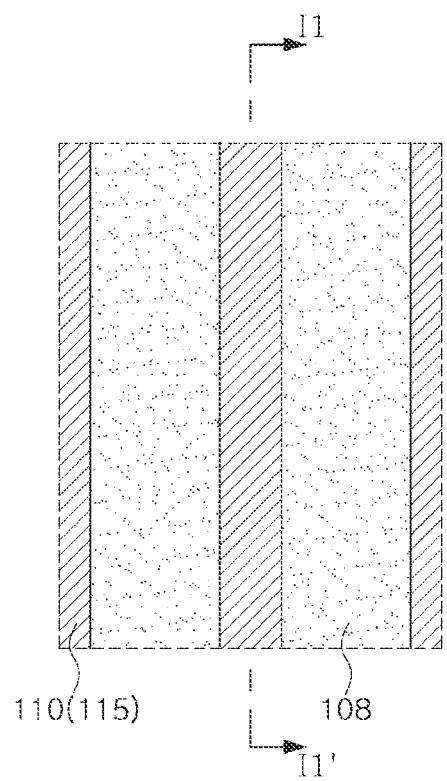

Referring to FIGS. 10A and 10B, a first insulating pattern layer 108 having a plurality of trenches that extend in a first direction D1 may be formed on a substrate 101, and a plurality of conductive lines 110 may be respectively arranged in the plurality of trenches.

The plurality of conductive lines 110 may extend in the first direction D1 and may be arranged side by side in a second direction D2. The first insulating pattern layer 108 may have upper surface that is substantially coplanar with upper surfaces of the plurality of first conductive lines 110. The plurality of conductive lines 110 may be electrically separated from the substrate 101 by an insulating layer 105. Each of the plurality of conductive lines 110 may include a single conductive layer or a plurality of conductive layers. For example, in some example embodiments, the conductive lines may have a double-layer structure that includes first and second conductive layers 112 and 115. The first conductive layer 112 may include tungsten (W), and the second conductive layer 115 may include titanium nitride (TiN). The first insulating pattern layer 108 may include at least one of a silicon oxide layer, a silicon nitride layer, and a silicon oxynitride layer.

Figure 11A:
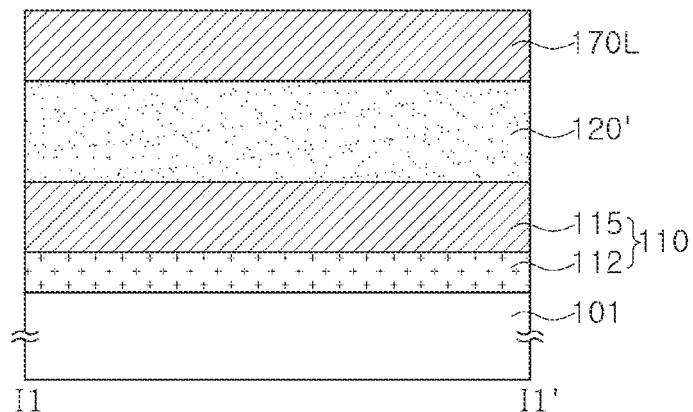
Figure 11B:
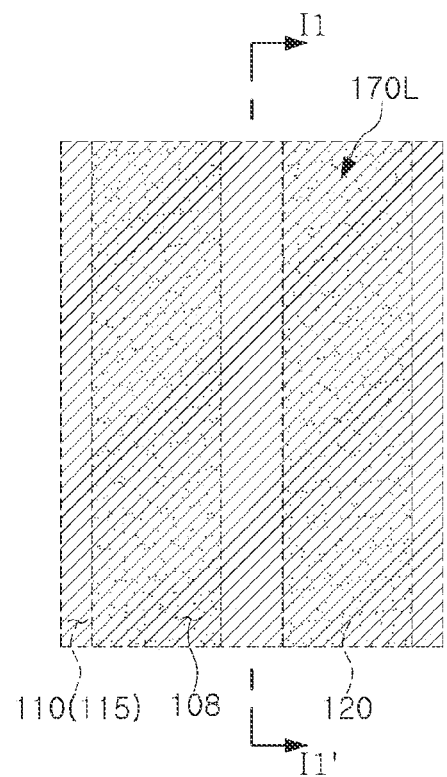

Referring to FIGS. 11A and 11B, an insulating layer 120' and a contact layer 170L may be sequentially formed on the plurality of conductive lines 110 and the first insulating pattern layer 108.

In the present process, before the trench is formed, a contact layer 170L may be formed together with an insulating layer 120' for the second insulating pattern layer to provide an arrangement in which first and second contacts and a channel layer overlap each other. The insulating layer 120' may be provided as a second insulating pattern layer in a final structure. The insulating layer 120' may include an oxygen-containing insulating material to smoothly introduce oxygen for curing a channel layer (for example, an oxide semiconductor) in an annealing process. For example, the insulating layer 120' may include silicon oxide ($SiO_2$) or silicon oxynitride (SiON).

The contact layer 170L may include a conductive material having oxygen diffusivity lower than oxygen diffusivity in a material of the insulating layer 120' under the same or equal conditions (for example, annealing conditions) to prevent oxygen permeation into a contact region (for example, a drain region) of a channel layer to be formed in a subsequent process. For example, the contact layer 170L may include at least one of TiN, W, Cu, Ti, Ta, TaN, and Mo. A thickness of the contact layer 170L may be set to correspond to a thickness of a region in which a channel layer and a source contact (first and second contacts) overlap in the horizontal direction, or may be set to be slightly larger than the thickness of the region (in consideration of a polishing process of FIG. 15A).

Figure 12A:
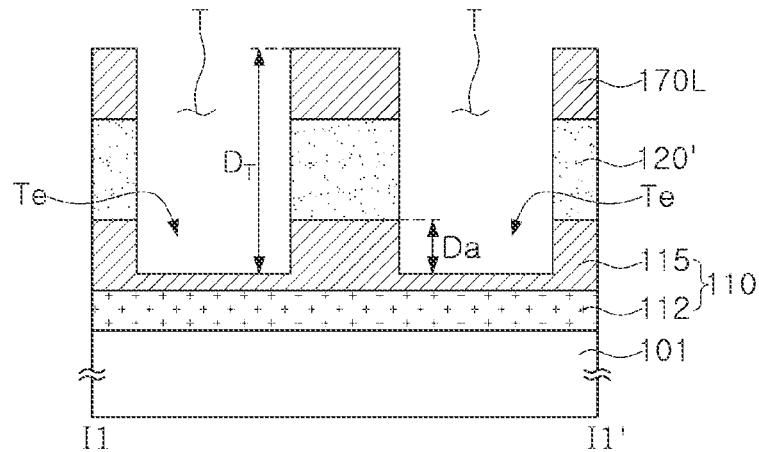
Figure 12B:
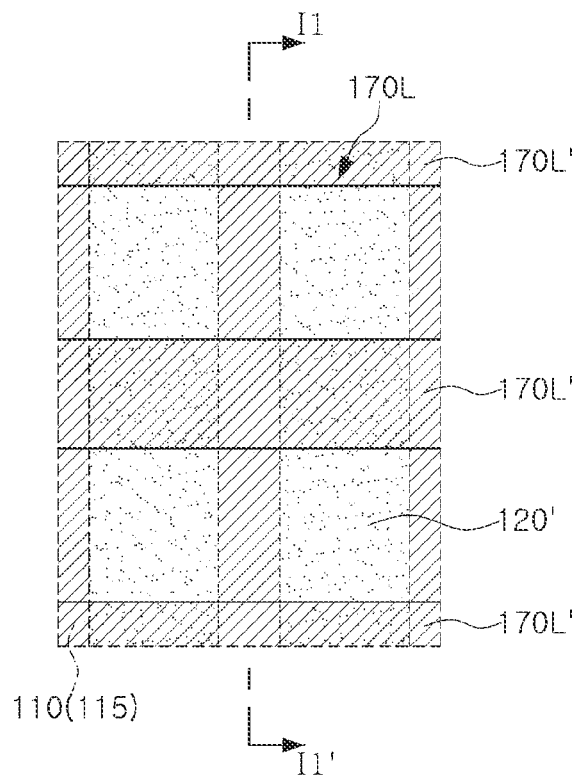

Referring to FIGS. 12A and 12B, a plurality of trenches T may be formed in the insulating layer 120' and the contact layer 170L to extend in a second direction, intersecting the first direction.

In the present process, the trench T may be formed to extend to a partial region Te of the conductive lines 110. Each of the conductive lines 110 may have a region exposed by the trench T. A recess, corresponding to the extension portion Te of the trench T, may be formed in the exposed region of the conductive line 110. As illustrated in FIG. 12A, the extension portion Te of the trench T may be in the second conductive layer 115 of the conductive line 110. Such a trench depth DT may be determined in consideration of a height of a channel layer (particularly, a horizontal channel element) to be formed in a subsequent process. For example, the trench depth DT may correspond to the height of the channel layer or may be set to be slightly larger than the height of the channel layer (in consideration of the polishing process of FIG. 15A). A depth Da of the extension portion Te of the trench T may determine a length of a portion of the conductive lines 110 in a horizontal direction that overlaps the channel layer (130L FIG. 13A).

Figure 13A:
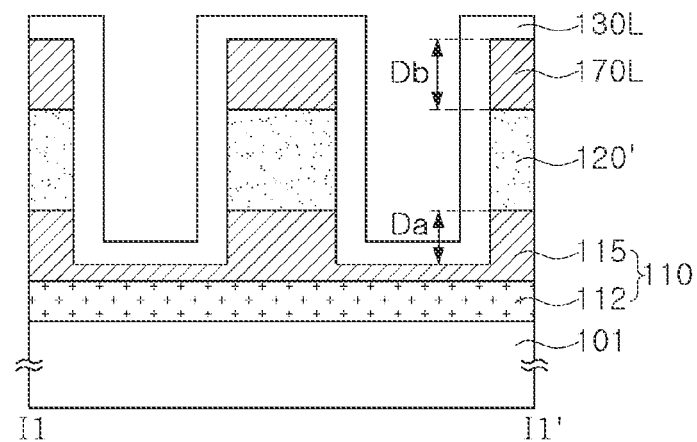
Figure 13B:
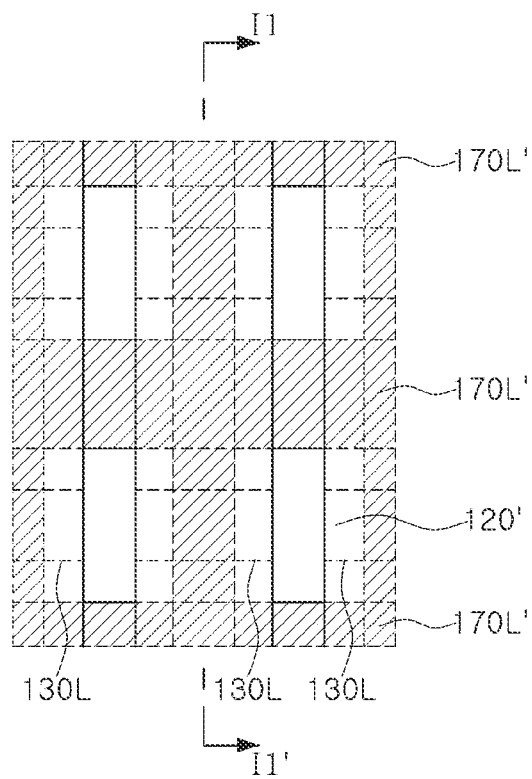

Referring to FIGS. 13A and 13B, the channel layer 130L may be formed along opposite sidewalls of the trench T to be connected to the exposed region of the conductive lines 110.

In some example embodiments, as illustrated in FIG. 13B, the channel layer 130L may be formed along adjacent cells (trenches) in a first direction and formed to be separated in units of cells in a second direction. The channel layer 130L may be in the region exposed by the extension portion Te of the trench T and on opposite sidewalls of the trench T, and may extend to an upper surface of the contact layer 170.

Due to the extension portion Te of the trench T, the overlapping portion of the conductive lines 110 and the channel layer 130L may have a predetermined length Db. Similarly, the overlapping portion of the conductive lines 110 and the channel layer 130L may have a predetermined length Da by forming a contact layer 170L in advance before forming the trench T. In the final structure, the length of the overlapping portion of the contact layer 170L and the channel layer 130L may be slightly reduced by a polishing process.

The channel layer 130L in some example embodiments may include an oxide semiconductor which may be stackable and which may have low leakage current characteristics. For example, the channel layer 130L may include one of IGZO, ITZO, ITGO, IWO, ITO, ZnO, and $Cu_2O$. In some example embodiments, the channel layer 130L may include $MoS_2$, $WS_2$, graphene, or h-BN.

In some example embodiments, an annealing process may be performed after the formation of the channel layer. For example, the annealing process may be performed in an oxygen atmosphere and may be performed in the range of 250° C. to 400° C. (for example, 300° C. to 350° C.) for 30 minutes to 12 hours (for example, 1 hour to 3 hours), with the present disclosure not limited thereto.

Figure 14A:
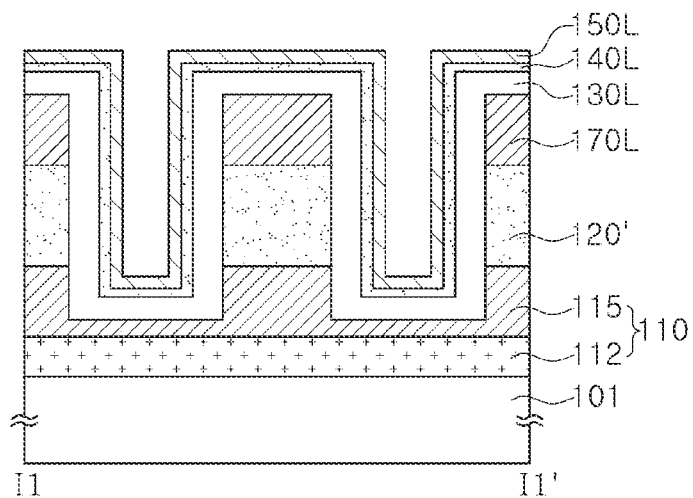
Figure 14B:
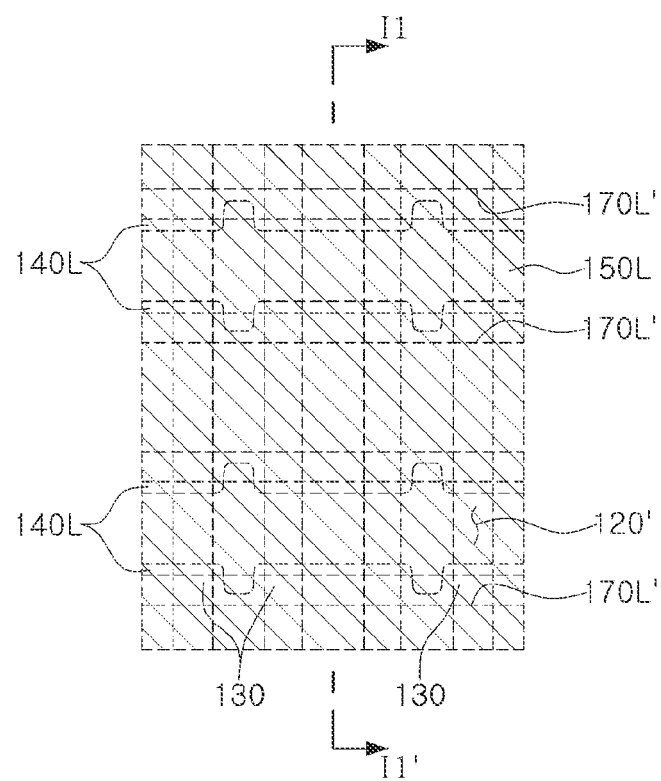

Referring to FIGS. 14A and 14B, a gate insulating layer 140L and a gate electrode layer 150L may be sequentially formed on internal sidewalls of the trench to cover the channel layer 130L.

In the present process, the gate insulating layer 140L and the gate electrode layer 150L may be formed conformally in sequence. After the gate insulating layer 140 may be formed in the trench along the channel layer 130, the gate electrode layer 150L may also be formed in the trench along the gate insulating layer 140. For example, the gate insulating layer 140L may include a silicon oxide layer, a silicon oxynitride layer, a high-k dielectric layer having a higher dielectric constant than the silicon oxide layer, or combinations thereof. The high-k film may include, but is not limited to, $HfO_2$, HfSiO, HfSiON, HfTaO, HfSiO, HfZrO, $ZrO_2$, $Al_2O_3$, or combinations thereof. The gate electrode layer 150L may include doped polysilicon, metal, conductive metal nitride, conductive metal silicide, conductive metal oxide, and/or a combination thereof. For example, the gate electrode layer 150L may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, and/or a combination thereof, but the present disclosure and example embodiments thereof are not limited thereto.

Figure 15A:
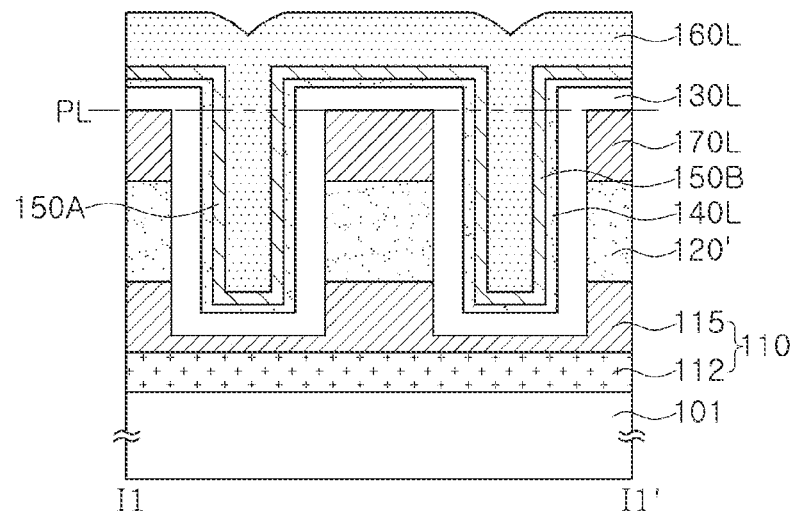
Figure 15B:
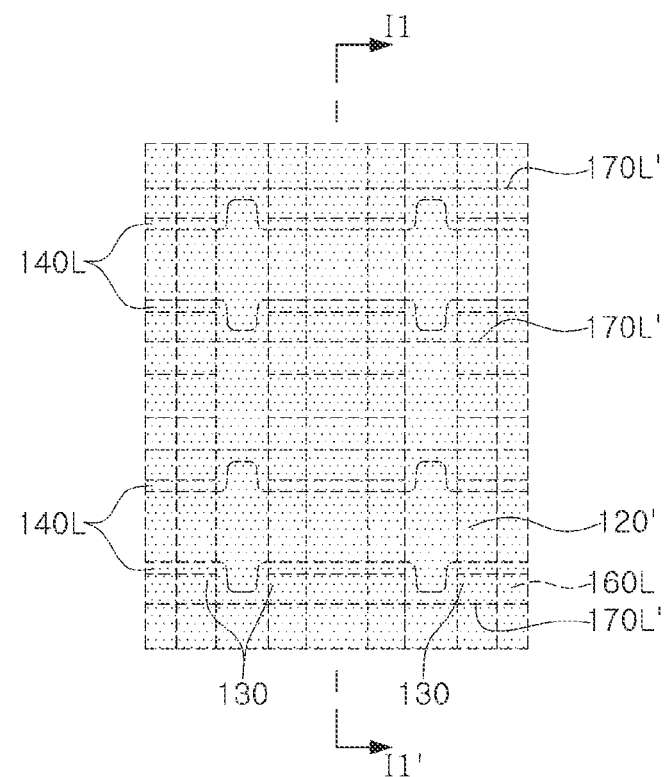

Referring to FIGS. 15A and 15B, a portion of the gate electrode layer 150L may be removed to form first and second gate electrodes 150A and 150B, and a buried insulating layer 160L may be formed in the trench T.

The first and second gate electrodes 150A and 150B may be formed by performing a selective anisotropic etching process on the gate electrode layer 150L. The selective etching of the gate electrode layer 150L may be anisotropically performed to remove the other portions while allowing a portion on the internal sidewall of the trench T, to remain. Thus, the first and second gate electrodes 150A and 150B may be formed.

Next, a buried insulating portion 160L may be formed to fill a space between the first and second gate electrodes 150A and 150B in the trench T. In some example embodiments, the buried insulating layer 160L may be formed of a material that is different from the material of the second insulating pattern layer 120', provided as an oxygen permeation path, to protect the first and second gate electrodes 150A and 150B from oxygen permeation. In some example embodiments, the buried insulating layer 160L may include an insulating material having an oxygen diffusivity that is lower than an oxygen diffusivity in the material of the second insulating pattern layer 120' under the same or equal conditions (for example, annealing conditions). For example, the buried insulating layer 160L may include silicon nitride ($SiN_x$), silicon oxynitride (SiON), or aluminum oxide ($AlO_x$).

Figure 16A:
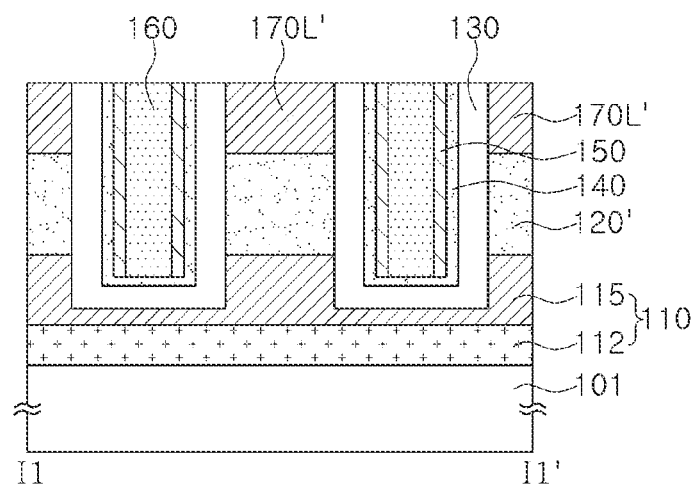
Figure 16B:
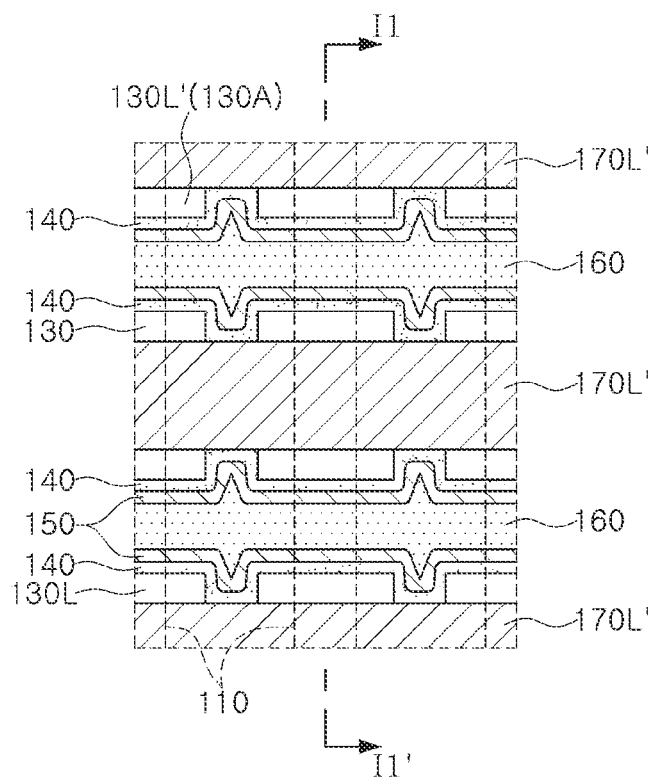

Referring to FIGS. 16A and 16B, a planarization process may be performed to expose an upper surface of the contact layer 170L.

Through the planarization process, a structure having two unit transistor cells facing each other may be formed in the trench T. The buried insulating portion 160 may extend in a first direction D1 to fill all or a portion of a remaining space in the trench T along a space between the first and second gate electrodes 150A and 150B (FIG. see 3). Due to the planarization process, the buried insulating portion 160 may have an upper surface that is substantially coplanar with an upper end of the channel layer 130, and the upper surface of the buried insulating portion 160 may be substantially coplanar with upper ends of the gate insulating layer 140 and the first and second gate electrodes 150A and 150B.

Figure 17A:
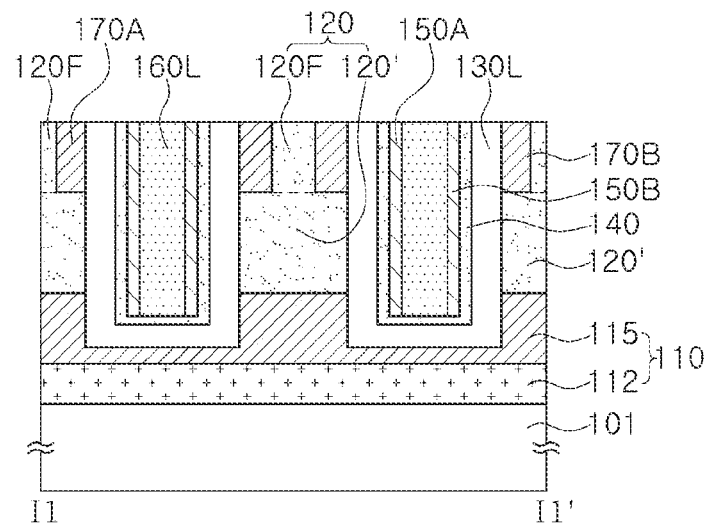
Figure 17B:
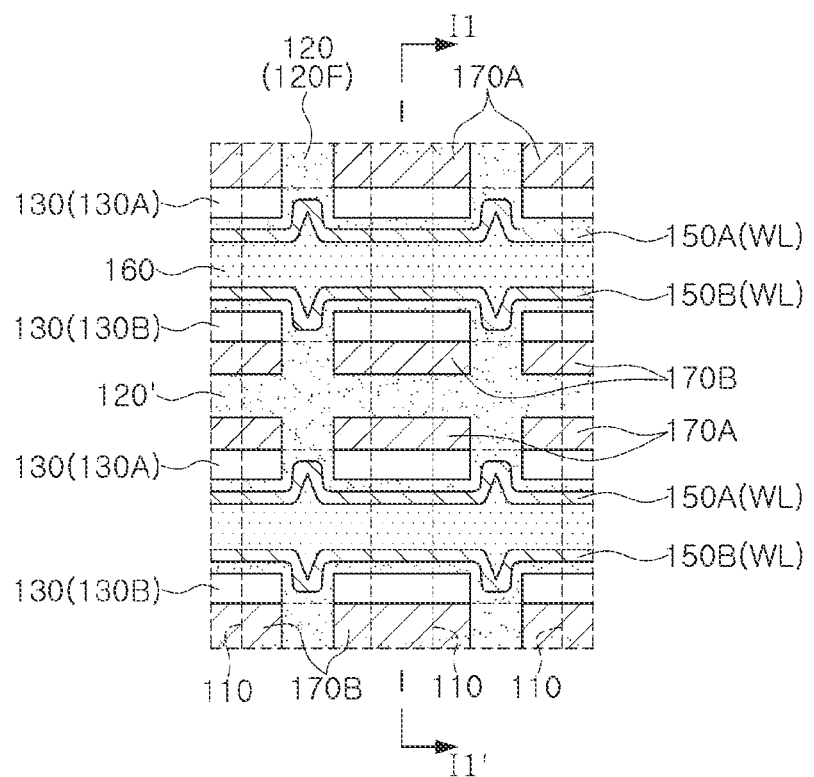

Referring to FIGS. 17A and 17B, the contact layer 170L may be patterned to form first and second contacts 170A and 170B, and the insulating portion 120F may fill a region in which the contact layer 170L is removed.

A portion of the contact layer 170L between the trenches T, may be removed to form the first and second contacts 170A and 170B in the same pattern as illustrated in FIG. 17B. In some example embodiments, the first and second contacts 170A and 170B may be patterned to have substantially the same width as the channel layer 130 in a width direction.

In the present process, a partial region of the second insulating pattern layer 120' may be exposed through the region in which the contact layer 170L is removed, for example, through a space between the first and second contacts 170A and 170B or a space between contacts 170A and 170B adjacent to each other in the first direction. Additionally, the region in which the contact layer 170L is removed may be filled with an insulating portion 120F to be planarized, so that a final second insulating pattern layer 120 may be completed. The insulating portion 120F for filling may include the same material as the second insulating pattern layer 120'.

As described above, after the memory cell transistor MCT is formed, an annealing process for the channel layer may be performed. The annealing process may be performed in combination with or instead of the previous annealing process, and may be performed under conditions similar to the above-described annealing conditions.

In such an annealing process, an exposed upper surface region of the second insulating pattern layer 120 (for example, the insulating portion 120F for filling) may be provided as a path through which oxygen is introduced and then reaches the channel layer 130 to improve characteristics of the channel layer 130. Such an annealing process may be performed alone or additionally after forming the data storage element DS as illustrated in FIGS. 2A and 2B.

Figure 18:
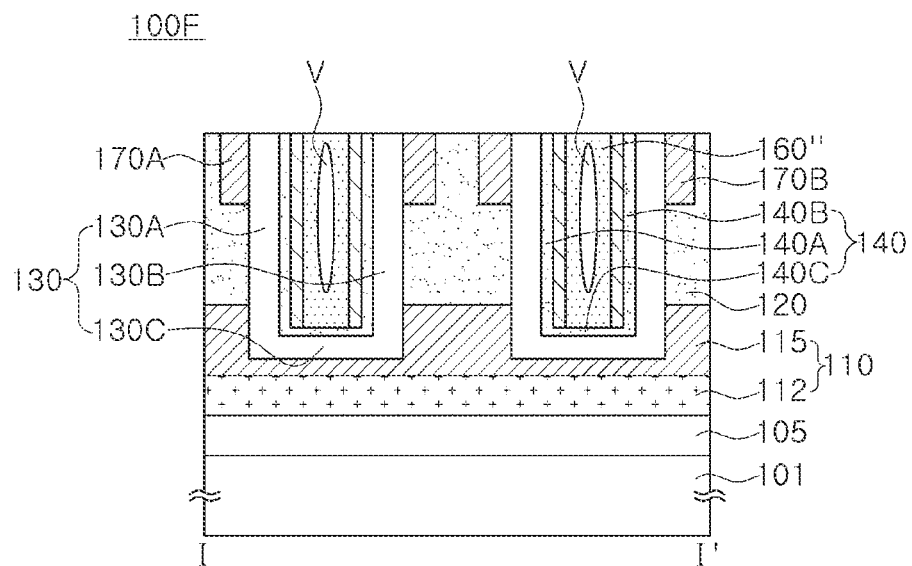
FIG. 18 is a cross-sectional view of a semiconductor device according to some example embodiments.
Figure 19:
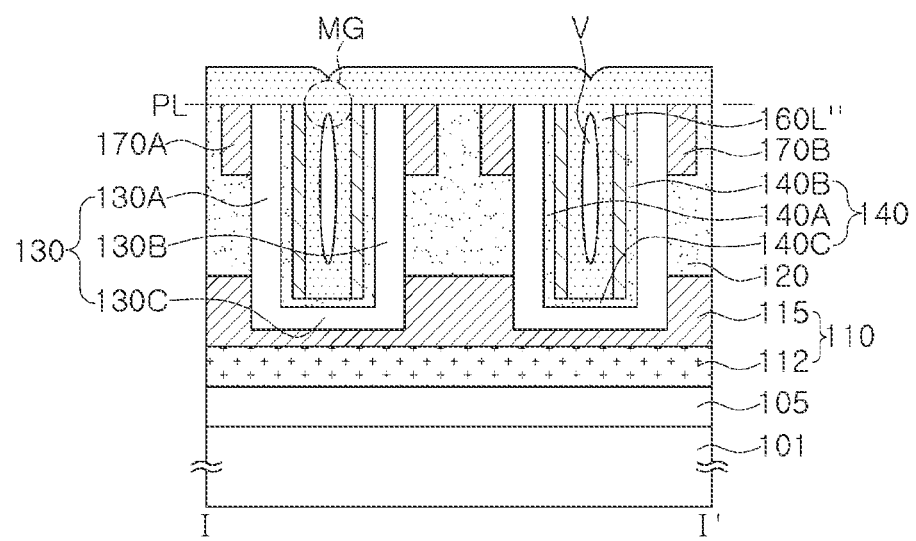
FIG. 19 is a cross-sectional view illustrating a process of forming the semiconductor device of FIG. 18.

FIG. 18 is a cross-sectional view of a semiconductor device according to some example embodiments, and FIG. 19 is a cross-sectional view illustrating a process of forming the semiconductor device of FIG. 18.

Referring to FIG. 18, a semiconductor device 100F according to some example embodiments may be understood to be similar to the semiconductor device 100 illustrated in FIGS. 1 to 4, except that a buried insulating layer 160 has a void V therein. In addition, elements of some example embodiments in accordance with FIG. 18 may be understood with reference to the descriptions of the same or similar elements of the semiconductor device 100 illustrated in FIGS. 1 to 4, unless otherwise specified.

The semiconductor device 100F according to some exemplary embodiments may include a buried insulating portion having a void therein. The buried insulating portion 160 may include an insulating material having a relatively low oxygen diffusivity to protect first and second gate electrodes 150A and 150B from oxygen permeation. For example, the buried insulating portion 160 may include silicon nitride ($SiN_x$), silicon oxynitride (SiON), or aluminum oxide ($AlO_x$). In some example embodiments, a void V may be formed in the buried insulating portion 160 to prevent oxidation of the first and second gate electrodes 150A and 150B and to reduce coupling between the first and second gate electrodes 150A and 150B.

The void V may be formed during formation of an insulating material for the buried insulating portion 160. As illustrated in FIG. 19, a desired void V may be formed by performing a deposition process of an insulating material under a condition in which a space between the first and second gate electrodes 150A and 150B is insufficiently filled, that is, to rapidly merge an insulating material deposited in an entrance portion of the space.

As described above, some example embodiments provide semiconductor devices having components, such as vertical channel transistors (VCT), which may secure ON-current characteristics even a channel layer having relatively low mobility is employed.

While some example embodiments have been shown and described above, it will be apparent to those skilled in the art that modifications and variations could be made without departing from the scope of the present inventive concepts as defined by the appended claims.

What is claimed is:

1. A semiconductor device comprising:
a substrate;
a conductive line that extends in a first direction on the substrate;
an insulating pattern layer on the substrate that covers the conductive line, the insulating pattern layer having a trench that extends in a second direction that crosses the first direction, the trench having an extension portion that extends into the conductive line;
a channel layer on opposite sidewalls of the trench and connected to a region of the conductive line that is exposed by the extension portion of the trench;
a first gate electrode and a second gate electrode on the channel layer, and respectively arranged along the opposite sidewalls of the trench;
a gate insulating layer between the channel layer and the first and second gate electrodes;
a buried insulating layer between the first and second gate electrodes within the trench; and
a first contact and a second contact respectively buried in regions adjacent to the opposite sidewalls of the trench in the insulating pattern layer, and respectively connected to upper regions of the channel layer.

2. The semiconductor device of claim 1, wherein the conductive line includes a first conductive line and a second conductive line on the first conductive line, and the extension portion of the trench is in the second conductive line.

3. The semiconductor device of claim 1, wherein the extension portion of the trench has a depth of 50 nm or less.

4. The semiconductor device of claim 1, wherein the channel layer includes first and second vertical channel elements respectively arranged along the opposite sidewalls of the trench, and wherein the channel layer includes a horizontal connection portion that connects the first and second vertical channel elements to each other at a bottom of the trench, the horizontal connection portion connected to the conductive line.

5. The semiconductor device of claim 4, wherein each of the first and second vertical channel elements has a lower region in contact with the conductive line and that overlaps the conductive line in a horizontal direction.

6. The semiconductor device of claim 4, wherein an upper surface of the conductive line has a level that is farther from the substrate than a lowermost level of the first and second gate electrodes is from the substrate.

7. The semiconductor device of claim 4, wherein the gate insulating layer includes a first gate insulating element between the first vertical channel element and the first gate electrode, a second gate insulating element between the second vertical channel element and the second gate electrode, and a bottom insulating layer that connects the first and second gate insulating elements to each other.

8. The semiconductor device of claim 4, wherein the first and second vertical channel elements have upper regions that are in contact with the first and second contacts and that overlap the first and second contacts, respectively.

9. The semiconductor device of claim 1, wherein the buried insulating layer has an upper surface that is substantially coplanar with upper ends of the first and second gate electrodes, an upper end of the gate insulating layer, and an upper end of the channel layer.

10. The semiconductor device of claim 1, wherein the buried insulating layer includes a material that differs from a material of the insulating pattern layer.

11. The semiconductor device of claim 10, wherein the buried insulating layer includes an insulating material having an oxygen diffusivity that is lower than an oxygen diffusivity in the material of the insulating pattern layer under equal conditions.

12. The semiconductor device of claim 1, wherein the buried insulating layer has a void therein.

13. A semiconductor device comprising:
a substrate;
a plurality of conductive lines that extend on the substrate in a first direction and are spaced apart from each other in a second direction that intersects the first direction;
an insulating pattern layer that extends in the second direction on the substrate, the insulating pattern layer having a plurality of trenches spaced apart from each other in the first direction, each trench of the plurality of trenches having a respective extension portion that extends into the plurality of conductive lines;
a plurality of channel layers on opposite sidewalls of each of the plurality of trenches and arranged in the second direction, the channel layers connected to regions in the plurality of conductive lines exposed by the extension portions of the plurality of trenches;
a plurality of first gate electrodes and a plurality of second gate electrodes on the plurality of channel layers in each of the plurality of trenches and respectively extending on the opposite sidewalls of each of the plurality of trenches;
a plurality of gate insulating layers between the plurality of channel layers and the plurality of first and second gate electrodes in each of the plurality of trenches;
a plurality of buried insulating portions, respectively within the plurality of trenches, and between the plurality of first and second gate electrodes; and
a plurality of first contacts and a plurality of second contacts buried in the insulating pattern layer and connected to upper regions of the plurality of channel layers adjacent to the opposite sidewalls of each of the plurality of trenches.

14. The semiconductor device of claim 13, wherein the plurality of channel layers include an oxide semiconductor, and
wherein the buried insulating portions includes an insulating material having an oxygen diffusivity that is lower than an oxygen diffusivity in a material of the insulating pattern layer under equal conditions.

15. The semiconductor device of claim 13, further comprising:
a plurality of data storage elements on the insulating pattern layer and electrically connected to the plurality of first and second contacts; and
a plurality of interconnection portions connecting respective ones of the plurality of data storage elements with respective ones of the plurality of first and second contacts.

16. The semiconductor device of claim 15, wherein the plurality of interconnection portions are respectively arranged on the plurality of first and second contacts and extend to upper ends of adjacent channel layers among the plurality of channel layers.

17. A semiconductor device comprising:
a substrate;
a conductive line extending in a first direction on the substrate;
an insulating pattern layer on the substrate and having a trench that extends in a second direction that intersects the first direction;
a channel layer arranged on opposite sidewalls of the trench and electrically connected to the conductive line at a bottom of the trench, the channel layer including an oxide semiconductor;
a first gate electrode and a second gate electrode respectively on the opposite sidewalls of the trench on the channel layer;
a gate insulating layer between the channel layer and the first and second gate electrodes and having a U-shape in a cross-section taken in the second direction;
a buried insulating portion between the first and second gate electrodes within the trench, the buried insulating portion including an insulating material that is different from a material of the insulating pattern layer; and
a first contact and a second contact electrically connected with respective upper regions of the channel layer,
wherein the trench has an extension portion that extends into the conductive line, and
wherein the channel layer has a lower region that is in contact with the conductive line and overlaps the conductive line in a horizontal direction.

18. The semiconductor device of claim 17, wherein the first and second contacts are respectively buried in regions adjacent to opposite sidewalls of the trench in the insulating pattern layer and are respectively in contact with upper regions of the channel layer.

19. The semiconductor device of claim 17, wherein the first contact and the second contact are respectively buried in the insulating pattern layer in regions adjacent to the opposite sidewalls of the trench.

20. The semiconductor device of claim 17, wherein the buried insulating portion has an oxygen diffusivity that is lower than that of the material of the insulating pattern layer under equal conditions.

* * * * *